(12) United States Patent
Gambogi, Jr. et al.

(10) Patent No.: US 7,749,037 B2
(45) Date of Patent: Jul. 6, 2010

(54) PROCESS FOR FABRICATING AN ORGANIC ELECTRONIC DEVICE USING LIQUID DEPOSITION AND DEVICES MADE BY THE PROCESS

(75) Inventors: William John Gambogi, Jr., Wilmington, DE (US); Norman Herron, Newark, DE (US); Eric Maurice Smith, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 84 days.

(21) Appl. No.: 11/045,192

(22) Filed: Jan. 28, 2005

(65) Prior Publication Data

US 2005/0191927 A1    Sep. 1, 2005

Related U.S. Application Data

(60) Provisional application No. 60/546,040, filed on Feb. 19, 2004.

(51) Int. Cl.
   *H01J 9/24* (2006.01)
(52) U.S. Cl. .......................... 445/24; 313/504; 313/506
(58) Field of Classification Search .................. 445/24; 313/498–512
   See application file for complete search history.

(56) References Cited

U.S. PATENT DOCUMENTS

| 4,268,541 | A * | 5/1981 | Ikeda et al. .................. 427/177 |
| 5,645,948 | A | 7/1997 | Shi et al. |
| 6,303,238 | B1 | 10/2001 | Thompson et al. |
| 6,670,645 | B2 | 12/2003 | Grushin et al. |
| 2001/0019782 | A1 | 9/2001 | Igarashi et al. |
| 2002/0187567 | A1 | 12/2002 | Yamazaki et al. |
| 2003/0140982 | A1 | 7/2003 | Seki et al. |
| 2004/0085711 | A1 * | 5/2004 | Merker et al. ................ 361/523 |
| 2004/0106006 | A1 | 6/2004 | Eriyama et al. |
| 2004/0214037 | A1 * | 10/2004 | Roberts et al. .............. 428/690 |

FOREIGN PATENT DOCUMENTS

| EP | 1 191 612 A2 | 3/2002 |
| EP | 1 191 614 A2 | 3/2002 |
| JP | 10 162955 A | 6/1998 |

(Continued)

OTHER PUBLICATIONS

Vadim Adamovich et al., High efficiency single dopant white electrophosphorescent light emitting diodes, New J. Chem., vol. 26:1171-1178, 2002.

(Continued)

*Primary Examiner*—Bumsuk Won
(74) *Attorney, Agent, or Firm*—John H. Lamming

(57) ABSTRACT

The present invention relates to a process for forming an organic electronic device having at least two organic layers. The process includes
(a) applying a first organic layer having a first organic material by a method selected from vapor deposition and liquid deposition from a first organic liquid medium;
(b) applying a second organic layer having a photoactive compound directly over at least a portion of the first organic layer by liquid deposition from a second organic liquid medium, wherein the first organic material is sparingly soluble in the second organic liquid medium.

15 Claims, 1 Drawing Sheet

FOREIGN PATENT DOCUMENTS

| | | |
|---|---|---|
| WO | WO 02/15645 A1 | 2/2002 |
| WO | WO 03/072681 | 9/2003 |

OTHER PUBLICATIONS

G. Gustafsson et al., Flexible light-emitting diodes made from soluble conducting polymers, Nature, vol. 357:477-479, 1992.

Kirk-Othmer, Photoconductive Polymers, Photoconductive Materials, vol. 18:837-860, 1996.

Patent Abstracts of Japan, Sep. 30, 1988, vol. 1998, No. 11.

Dongge Ma et al., "Novel Heterolayer Organic Light-Emitting Diodes Based on a Conjugated Dendrimer" In Advanced Functional Materials, vol. 12, No. 8, Aug. 2002, pp. 507-611, ISSN 1616-301X. Wiley Intersciences. Wienheim, Germany.

* cited by examiner

PROCESS FOR FABRICATING AN ORGANIC ELECTRONIC DEVICE USING LIQUID DEPOSITION AND DEVICES MADE BY THE PROCESS

CROSS REFERENCE TO RELATED APPLICATIONS

This application claims priority from U.S. Provisional Application No. 60/546,040, filed Feb. 19, 2004.

BACKGROUND OF THE INVENTION

1. Field of the Invention

The present invention relates to processes for making organic electronic devices. The invention further relates to devices made by such processes.

2. Background

In organic electronic devices, such as light-emitting diodes ("OLED"), that make up OLED displays, the organic active layer is sandwiched between two electrical contact layers in an OLED display. In an OLED the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used.

Devices which use photoactive materials, frequently include one or more organic charge transport layers, which are positioned between the photoactive (e.g., light-emitting) layer and one of the contact layers. A hole transport layer may be positioned between the photoactive layer and the hole-injecting contact layer, also called the anode. An electron transport layer may be positioned between the photoactive layer and the electron-injecting contact layer, also called the cathode. Fabrication of organic electronic devices by solution processing techniques, such as spin-coating or ink-jetting, can have manufacturing advantages over vapor deposition techniques. In the field of OLEDs, multilayer devices have demonstrated performance advantages over simple one-, or two-layer devices. Multilayer OLEDs with small organic molecules are generally fabricated by vapor deposition techniques. Multilayer polymeric OLEDs have been fabricated by solution processing techniques using one water-soluble organic material and one solvent-soluble organic material. For example, a transport layer of poly(ethylenedioxythiophene)/polystyrenesulfonic acid ("PEDT/PSSA") is formed from an aqueous medium and overcoated with a light-emitting phenylenevinylene polymer in an organic solvent.

The fabrication of multilayer OLED devices with organic light-emitting materials by non-aqueous solution processing or the combination of vapor deposition and non-aqueous solution processing techniques has generally been unavailable. The organic materials that are useful with such light-emitting materials generally have similar solubility properties in most organic liquids.

There is a continuing need for processes to form organic electronic devices.

SUMMARY OF THE INVENTION

One embodiment is a new process for forming an organic electronic device comprising at least two organic layers, said process comprising (a) applying a first organic layer comprising a first organic material by a method selected from vapor deposition and liquid deposition from a first organic liquid medium;

(b) applying a second organic layer comprising a photoactive material directly over the first organic layer by liquid deposition from a second organic liquid medium, wherein the first organic material is sparingly soluble in the second organic liquid medium.

Another embodiment is a new organic electronic device made by the above process.

The foregoing general description and the following detailed description are exemplary and explanatory only and are not restrictive of the invention, as defined in the appended claims.

DESCRIPTION OF THE DRAWINGS

The invention is illustrated by way of example and not limitation in the accompanying figures.

DETAILED DESCRIPTION OF THE PREFERRED EMBODIMENTS

Figure 1:
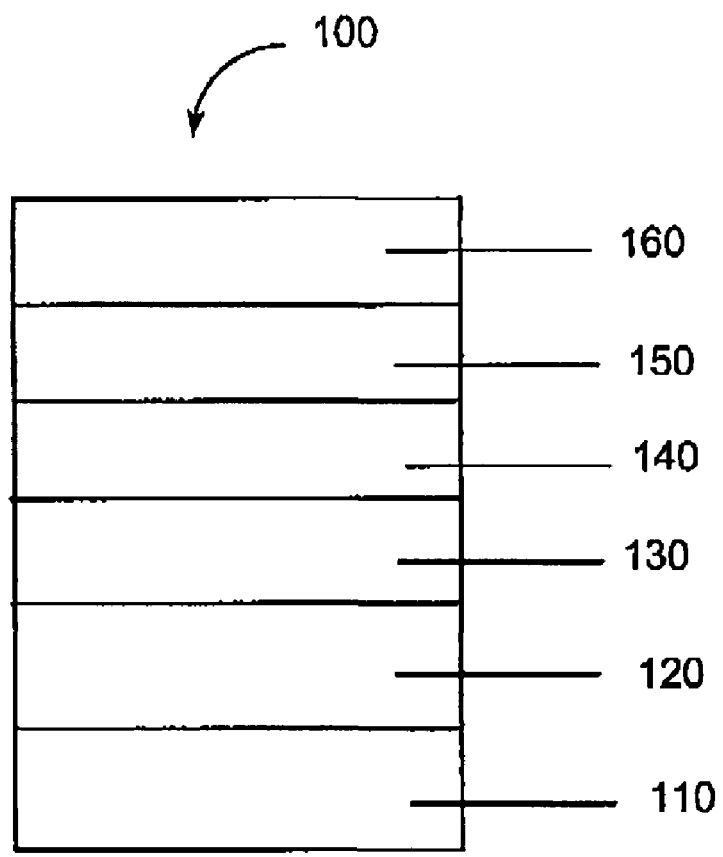
FIG. 1: An illustrative example of one organic electronic device which can be made by the new process.

One embodiment is a new process for forming an organic electronic device comprising at least two organic layers, said process comprising (a) applying a first organic layer comprising a first organic material by a method selected from vapor deposition and liquid deposition from a first organic liquid medium;

(b) applying a second organic layer comprising a photoactive material directly over at least a portion of the first organic layer by liquid deposition from a second organic liquid medium, wherein the first organic material is sparingly soluble in the second organic liquid medium.

In the new process, a first organic layer is applied by a vapor deposition process, or by liquid deposition from an organic liquid medium. The first organic layer comprises an organic material. The organic material can be an active material or an inactive material. As used herein, the term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

Any conventional vapor deposition technique can be used. Examples of vapor deposition techniques include, but are not limited to, thermal evaporation, chemical vapor deposition, and the like.

Any conventional liquid deposition technique can be used. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing. The organic liquid medium can be any one in which the first organic material is soluble or dispersible and from which a film can be formed. The combination of the liquid medium and the first organic material can be in the form of a solution, a dispersion, an emulsion, or other forms.

In one embodiment, the first organic material is a charge transport material. As used herein, the term "charge transport material" refers to material that can receive a charge from an electrode and facilitate its movement through the thickness of the material with relatively high efficiency and small loss of charge. Hole transport materials are capable of receiving a positive charge from an anode and transporting it. Electron transport materials are capable of receiving a negative charge from a cathode and transporting it.

In one embodiment, the first organic material is a hole transport material. Any material which functions as a hole transport composition for the photoacitve material can be used. Examples of hole transport materials have been summarized for example, in Kirk-Othmer Encyclopedia of Chemical Technology, Fourth Edition, Vol. 18, p. 837-860, 1996, by Y. Wang. Both hole transport molecules and polymers can be used. Commonly used hole transport molecules are: N,N'-diphenyl-N,N'-bis(3-methylphenyl)-[1,1'-biphenyl]-4,4'-diamine (TPD), 1,1-bis[(di-4-tolylamino)phenyl] cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 4,4'-dicarbazole-biphenyl (CBP), 3,5-bis(N-carbazolyl)benzene (mCP), 4,4'-bis[N-(1-naphthyl)-N-phenylamino]biphenyl (NPB), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine. Commonly used hole transport polymers are polyvinylcarbazole, poly(ethylenedioxythiophene), (phenylmethyl)polysilane, and polyaniline. The hole transport material may comprise a polymer, such as polystyrene or polycarbonate, doped with at least one hole transport small molecule, such as those mentioned above. Mixtures of materials can be used.

The organic liquid medium for hole transport materials generally comprises an organic liquid. The exact liquid selected will depend on the hole transport material used. Examples of some suitable liquids include, but are not limited to, chlorinated organic liquids, such as chloroform, dichloromethane, and chlorobenzene; alkylated aromatic compounds, such as toluene and xylene; tetrahydrofuran; and N,N-dimethylpyrrolidone.

In one embodiment, the first organic material is an electron transport material. Any material which functions as an electron transport composition for the photoactive material can be used. Examples of electron transport materials include, but are not limited to, metal chelated oxinoid compounds, such as tris(8-hydroxyquinolato)aluminum ($Alq_3$); phenanthrolines, such as 4,k7-diphenyl-1,10-phenanthroline (DPA), 2,9-dimethyl-1,10-phenanthroline (DMPA), and 4,7-diphenyl-2,9-dimethyl-1,10-pheanthroline (DDPA); quinoxalines; and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ); imidazoles, such as 1,3,5-tri(phenyl-2-benzimidazole)benzene (TPBI); and mixtures thereof.

The organic liquid medium for electron transport materials generally comprises an organic liquid. The exact liquid selected will depend on the electron transport material used. Examples of some suitable liquids include, but are not limited to, chlorinated organic liquids, such as chloroform, dichloromethane, and chlorobenzene; alkylated aromatic compounds, such as toluene and xylene; tetrahydrofuran; and N,N-dimethylpyrrolidone.

The first organic liquid medium may include additional materials. The additional material may act as a processing aid, may improve the physical or electrical properties of films containing the first organic material, and/or may decrease the aggregation of the first organic material.

The first organic layer can be patterned or unpatterned.

In the new process, a second organic layer comprising a photoactive material is applied directly over at least a portion of the first organic layer by liquid deposition from a second organic liquid medium. The term "photoactive" refers to any material that exhibits electroluminescence and/or photosensitivity. The term "directly over" is intended to mean that the two layers are in physical contact.

The photoactive material can be a polymer, such as a phenylenevinylene polymer or copolymer, a fluorene polymer or copolymer, and mixtures thereof; a small molecule organic material, such as anthracene, thiadiazole derivatives, and coumarin derivatives; or an organometallic compound, such as metal chelated oxinoid compounds, such as tris(8-hydroxyquinolato)aluminum ($Alq_3$) and cyclometallated metal complexes.

In one embodiment, the photoactive material is an organometallic compound. In one embodiment, the organometallic compound is a complex of at least one metal selected from Re, Ru, Os, Rh, Ir, Pd, Pt, and Au. In one embodiment, the organometallic compound is a complex having at least one ligand selected from an aryl-N-heterocycle and a heteroaryl-N-heterocycle, hereinafter referred to collectively as the "first ligand". The first ligand has an aromatic or heteroaromatic ring joined to a N-heteroaromatic ring by a single bond. The first ligand is coordinated to the metal by two points of attachment and is a monoanionic, bidentate ligand, The two points of attachment are through the nitrogen atom of the N-heteroaromatic ring and to a carbon of the aromatic or heteroaromatic ring.

The aromatic or heteroaromatic ring may comprise a single ring or a fused ring system. Examples of aromatic rings include, but are not limited to phenyl, naphthyl, and anthracenyl. Examples of heteroaromatic rings include, but are not limited to, rings derived from thiophene, dithiole, and pyridine. The N-heteroaromatic ring may comprises a single ring or fused ring system. Examples of N-heteroaromatic groups include, but are not limited to, pyridine, pyrazine, pyrimidine, and quinolines.

The organometallic compound can have one or more than one first ligand. The organometallic compound can have additional ligands to fill the coordination sphere of the metal. The additional ligands can be anionic or nonionic. The additional ligands can be monodentate or multidentate. Examples of monodentate anionic ligands include, but are not limited to, H⁻ ("hydride") and ligands having C, O or S as coordinating atoms. Coordinating groups include, but are not limited to alkoxide, carboxylate, thiocarboxylate, dithiocarboxylate, sulfonate, thiolate, nitrile, aryl, carbamate, dithiocarbamate, thiocarbazone anions, sulfonamide anions, and the like. In some cases, ligands discussed below as bidentate, such as β-enolates and phosphinoakoxides, can act as monodentate ligands. The monodentate ligand can also be a coordinating anion such as halide, nitrate, sulfate, hexahaloantimonate, and the like. These ligands are generally available commercially.

The multidentate ligands generally have N, O, P, or S as coordinating atoms and form one or more 5- or 6-membered rings when coordinated to the metal. Suitable coordinating groups include amino, imino, amido, alkoxide, carboxylate, phosphino, thiolate, and the like. Examples of suitable parent compounds for these ligands include, but are not limited to β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Examples of nonionic ligands include, but are not limited to CO, mono- and multidentate phosphine ligands, isonitriles, imines, and diimines.

In one embodiment of the organometallic compound, the metal is selected from Os, Ir, and Pt. In one embodiment, the first ligand is selected from a phenyl-pyridine, phenyl-pyrimidine, phenyl-quinoline, bipyridine and thienyl-pyridine. In one embodiment, there is an additional β-enolate ligand.

Examples of specific organometallic compounds have been disclosed in, for example, U.S. Pat. Nos. 6,670,645 and 6,303,238, and in published applications US 2001/0019782, EP 1191612, WO 02/15645, and EP 1191614.

The second organic layer can comprise additional materials. For example, a fluorescent dye may be present to alter the color of emission, or a diluent may be present. A diluent may be a charge transport material or an inert matrix. A diluent may comprise polymeric materials, small molecule or mixtures thereof. A diluent may act as a processing aid, may improve the physical or electrical properties of films containing the organometallic compound, may decrease self-quenching in the organometallic compounds described herein, and/or may decrease the aggregation of the organometallic compounds described herein. Non-limiting examples of suitable polymeric materials include poly(N-vinyl carbazole), conjugated polymers, and polysilane. Non-limiting examples of suitable small molecules includes 4,4'-N,N'-dicarbazole biphenyl or tertiary aromatic amines. Examples of suitable conjugated polymers include polyarylenevinylenes, polyfluorenes, polyoxadiazoles, polyanilines, polythiophenes, polyphenylenes, copolymers thereof and combinations thereof. The conjugated polymer can be a copolymer having non-conjugated portions, for example, acrylic, methacrylic, or vinyl monomeric units. In one embodiment, the diluent comprises homopolymers and copolymers of fluorene and substituted fluorenes.

The second organic liquid medium is one in which the photoactive material can be dissolved or dispersed to such an extent that a film can be formed. The second organic liquid medium is also one in which the first organic material is sparingly soluble. As used herein, the term "sparingly soluble" is intended to mean that the material is not completely insoluble, but only a small amount will dissolve or disperse. In general, when a material is sparingly soluble, from 0.1 to 5 mg will dissolve in a 1 mL sample of the liquid. In one embodiment, from 0.3 to 3 mg will dissolve in a 1 mL sample.

When the second layer is applied to at least a portion of the first layer, the first organic material is dissolved or dispersed in the second organic liquid medium only to a slight extent. This can result in a slight blurring of the interface between the first and second layers, which can be beneficial to device performance.

The second organic liquid medium generally comprises an organic liquid. The exact liquid selected will depend on the nature of the first organic material and the photoactive material. In one embodiment, the photoactive material is an organometallic compound and the second organic liquid medium comprises a fluorinated aromatic compound, a linear or branched aliphatic ketone or a linear or branched aliphatic ester. Mixtures of liquids can be used. In one embodiment, the second organic liquid medium comprises a liquid selected from ethyl acetate, 4-methyl-4-hydroxy-2-pentanone, trifluorotoluene, and methylethylketone.

Any conventional liquid deposition technique can be used to apply the second organic layer.

The second organic layer can be patterned or unpatterned. The second organic layer can have a pattern that is the same as or different from the pattern of the first organic layer.

Electronic Device

The present invention also relates to an electronic device made by the above process. Types of organic electronic devices that can be made by the new process include, but are not limited to, (1) devices that convert electrical energy into radiation (e.g., a light-emitting diode ("OLED"), light emitting diode display, or diode laser), (2) devices that detect signals through electronic processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include two or more organic semiconductor layers (e.g., a transistor or diode).

One illustration of an organic electronic device structure is shown in FIG. 1. The device 100 has an anode layer 110 and a cathode layer 160. Adjacent to the anode is a layer 120 comprising hole transport material. Adjacent to the cathode is a layer 140 comprising an electron transport and/or anti-quenching material. Between the hole transport layer and the electron transport and/or anti-quenching layer is the photoactive layer 130. As an option, devices frequently use another electron transport layer 150, next to the cathode. Layers 120, 130, 140, and 150 are individually and collectively referred to as the active layers.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are describe in Markus, John, *Electronics and Nucleonics Dictionary*, 470 and 476 (McGraw-Hill, Inc. 1966).

Materials suitable for use in the hole transport layer 120, the photoactive layer 130, and the electron transport layer 140, have been discussed above.

The anode 110, is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," *Nature* vol. 357, pp 477-479 (11 Jun. 1992). At least one of the anode and cathode should be at least partially transparent to allow the generated light to be observed.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and Li$_2$O can also be deposited between the organic layer and the cathode layer to lower the operating voltage.

It is known to have other layers in organic electronic devices. For example, there can be a layer (not shown) between the anode 110 and hole transport layer 120 to facilitate positive charge transport and/or band-gap matching of the layers, or to function as a protective layer. Layers that are known in the art can be used. In addition, any of the above-described layers can be made of two or more layers. Alternatively, some or all of anode layer 110, the hole transport layer 120, the electron transport layers 140 and 150, and cathode layer 160, may be surface treated to increase charge carrier transport efficiency. The choice of materials for each of the component layers is preferably determined by balancing the goals of providing a device with high device efficiency with device operational lifetime.

It is understood that each functional layer may be made up of more than one layer.

The device can be prepared by a variety of techniques, including sequentially depositing the individual layers on a suitable substrate. Substrates such as glass and polymeric films can be used. Metal electrodes can be formed using conventional vapor deposition techniques can be used, such as thermal evaporation, chemical vapor deposition, and the like. If an organic electrode is used, it can be applied from solutions or dispersions in suitable liquids, using any liquid deposition techniques, as described above. In general, the different layers will have the following range of thicknesses: anode 110, 500-5000 Å, preferably 1000-2000 Å; hole transport layer 120, 50-2000 Å, preferably 200-1000 Å; photoactive layer 130, 10-2000 Å, preferably 100-1000 Å; electron transport layer 140 and 150, 50-2000 Å, preferably 100-1000 Å; cathode 160, 200-100000 Å, preferably 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

As used herein, the term "aliphatic" is intended to mean an organic compound or group which does not contain a ring of atoms with delocalized pi-electrons.

The term "aromatic" is intended to mean an organic compound or group which contains at least one ring of atoms with delocalized pi-electrons.

The term "aryl" is intended to mean a group derived from an aromatic hydrocarbon having one point of attachment, which group may be unsubstituted or substituted. The term "heteroaryl" is intended to mean a group derived from an aromatic group having at least one heteroatom and having one point of attachment, which group may be unsubstituted or substituted.

The term "film" refers to a coating covering a desired area. The area can be as large as an entire display, or as small as a single pixel. Films can be formed by any conventional deposition technique, including vapor deposition and liquid deposition.

As used herein, "organic" refers to a material that is composed primarily of carbon and hydrogen atoms. As used herein, a "hydrocarbyl" moiety may also contain heteroatoms, e.g., N, O, P, Si, and the like.

The term "compound" is intended to mean an electrically uncharged substance made up of molecules that further consist of atoms, wherein the atoms cannot be separated by physical means. The term "ligand" is intended to mean a molecule, ion, or atom that is attached to the coordination sphere of a metallic ion. The term "complex", when used as a noun, is intended to mean a compound having at least one metallic ion and at least one ligand.

In addition, the IUPAC numbering system is used throughout, where the groups from the Periodic Table are numbered from left to right as 1 through 18 (CRC Handbook of Chemistry and Physics, 81$^{st}$ Edition, 2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, "the", "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Unless otherwise defined, all letter symbols in the figures represent atoms with that atomic abbreviation. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

The following examples illustrate certain features and advantages of the present invention. They are intended to be illustrative of the invention, but not limiting. All percentages are by weight, unless otherwise indicated.

Example 1

This example illustrates the formation of an OLED device using the new process, in which the first organic layer is apply by vapor deposition. In this example:

"NPD" is 4,4'-bis[N-(1-naphthyl)-N-phenylamino]biphenyl, from H. W. Sands Corp. (Jupiter, Fla.)

"TPBI" is 1,3,5-tri(phenyl-2-benzimidazole)benzene, and was made according to the procedure in Examples 1 and 2 of U.S. Pat. No. 5,645,948.

"mCP" is 3,5-bis(N-carbazolyl)benzene, and was made according to the procedure of Adamovich et al. in New J. Chem., 2002, 26, 1171-1178.

"Ir compound 1" has the structure

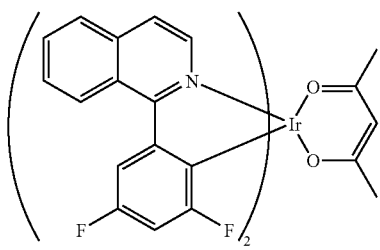

The compound was made according to the procedure in Example 10 of U.S. Pat. No. 6,670,645.

Substrates of glass with a patterned layer of indium tin oxide were cleaned and treated with oxygen plasma. The substrates were then masked and loaded into a vacuum evaporator chamber. The chamber was evacuated, reaching a pressure of $1\times10^{-6}$ mbar. A 100 Å layer of copper phthalocyanine was then thermally evaporated, followed by a 300 Å layer of NPD. The chamber was then backfilled with nitrogen and the substrates were removed. The substrates were then spin-coated with a 1% w/v solution of Ir compound 1 and mCP (8:92) in 4-hydroxy-4-methyl-2-pentanone. The inactive area of the device was cleaned with chloroform-wetted swabs, removing excess film. The substrates were then masked and loaded into a vacuum evaporator chamber. The chamber was evacuated, reaching a pressure of $3\times10^{-7}$ mbar, and then a 600 Å layer of TPBI was thermally evaporated. The chamber was backfilled with nitrogen, a new mask was placed over the substrates, and chamber was re-evacuated. After reaching a pressure of $8\times10^{-7}$ mbar, a 10 Å layer LiF was thermally evaporated, followed by a 2000 Å layer of Al. The chamber was then backfilled with nitrogen and the devices were encapsulated using standard techniques.

What is claimed is:

1. A process for forming an organic electronic device comprising at least two organic layers, said process comprising
   (a) applying a first organic layer comprising a first organic material that can be either active or inactive by a method selected from vapor deposition and liquid deposition from a first organic liquid medium;
   (b) applying a second organic layer comprising an organometallic photoactive compound directly over at least a portion of the first organic layer by liquid deposition from a second organic liquid medium, wherein the first organic material is sparingly soluble in the second organic liquid medium, and the first organic liquid medium has solubility in the second organic liquid medium in the range of from 0.1 mg to 5.0 mg per mL.

2. The process of claim 1, wherein the first organic material is a charge transport material.

3. The process of claim 2, wherein the first organic material is a hole transport material.

4. The process of claim 1, wherein the organometallic compound is a complex of at least one metal selected from Re, Ru, Os, Rh, Ir, Pd, Pt, and Au.

5. The process of claim 4, wherein the metal is selected from Os, Ir, and Pt.

6. The process of claim 5, wherein the at least one first ligand is selected from a phenyl-pyridine, phenyl-pyrimidine, phenyl-quinoline, bipyridine and thienyl-pyridine.

7. The process of claim 1, wherein the organometallic compound is a complex having at least one first ligand selected from an aryl-N-heterocycle and a heteroaryl-N-heterocycle.

8. The process of claim 1, wherein the second layer further comprises a diluent.

9. The process of claim 1, wherein the second organic liquid medium comprises an organic liquid selected from fluorinated aromatic compounds, linear aliphatic ketones, branched aliphatic ketones, linear aliphatic esters, branched aliphatic esters, and mixtures thereof.

10. The process of claim 9, wherein the metal is selected from Os, Ir, and Pt, and the organic liquid is selected from trifluorotoluene, ethyl acetate, 4-methyl-4-hydroxy-2-pentanone, and methylethylketone.

11. The process of claim 1, wherein the first organic material is inactive.

12. The process of claim 1, wherein the first organic layer is either patterned or unpatterned.

13. The process of claim 1, wherein the second organic layer is either patterned or unpatterned.

14. The process of claim 13, wherein the second organic layer is patterned.

15. The process of claim 1, wherein liquid deposition is selected from the group of techniques consisting of spin coating, gravure coating, curtain coating, dip coating, slot-die coating, spray-coating, and continuous nozzle coating.

* * * * *

UNITED STATES PATENT AND TRADEMARK OFFICE
CERTIFICATE OF CORRECTION

PATENT NO. : 7,749,037 B2  
APPLICATION NO. : 11/045192  
DATED : July 6, 2010  
INVENTOR(S) : William John Gambogi, Jr., Norman Herron and Eric Maurice Smith It is certified that error appears in the above-identified patent and that said Letters Patent is hereby corrected as shown below:

Col. 9 line 39 through Col. 10, line 6; should read;

1. A process for forming an organic electronic device comprising at least two organic layers, said process comprising
   (a) applying a first organic layer comprising a first organic material that can be either active or inactive by a method from vapor deposition and liquid deposition from a first organic liquid medium;
   (b) applying a second organic layer comprising an organometallic photoactive compound directly over at least a portion of the first organic layer by a liquid deposition from a second organic medium, wherein the first organic material is sparingly soluble in the second organic liquid medium, and the first organic ~~liquid medium~~ material has solubility in the second organic liquid medium in the range of from 0.1 mg to 5.0 mg per mL.

Signed and Sealed this  
Twenty-fourth Day of April, 2012

David J. Kappos  
*Director of the United States Patent and Trademark Office*